United States Patent
Bhugra et al.

(10) Patent No.: US 7,082,493 B1
(45) Date of Patent: Jul. 25, 2006

(54) CAM-BASED SEARCH ENGINES AND PACKET COPROCESSORS HAVING RESULTS STATUS SIGNALING FOR COMPLETED CONTEXTS

(75) Inventors: Harmeet Bhugra, San Jose, CA (US); Michael Miller, Saratoga, CA (US); John R. Mick, Jr., Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 311 days.

(21) Appl. No.: 10/698,246

(22) Filed: Oct. 31, 2003

Related U.S. Application Data

(60) Provisional application No. 60/516,178, filed on Oct. 31, 2003.

(51) Int. Cl.
*G06F 12/00* (2006.01)
(52) U.S. Cl. ........................................... 711/108
(58) Field of Classification Search ................ None
See application file for complete search history.

(56) References Cited

U.S. PATENT DOCUMENTS

| | | | |
|---|---|---|---|
| 6,226,710 B1 * | 5/2001 | Melchior | 711/108 |
| 6,591,261 B1 | 7/2003 | Arthurs | |
| 6,629,099 B1 * | 9/2003 | Cheng | 707/10 |
| 6,845,024 B1 * | 1/2005 | Wanzakhade et al. | 365/49 |
| 6,944,710 B1 * | 9/2005 | Regev et al. | 711/108 |
| 2002/0080789 A1 * | 6/2002 | Henderson et al. | 370/392 |

* cited by examiner

*Primary Examiner*—Mano Padmanabhan
*Assistant Examiner*—Duc T Doan
(74) *Attorney, Agent, or Firm*—Myers Bigel Sibley & Sajovec PA

(57) ABSTRACT

CAM-based search engines and packet coprocessors include control logic that supports direct reads of information that summarizes the done status of multiple contexts being handled by the search engine device. This done status information may be maintained in dedicated registers that are configured to support high bandwidth utilization from a data port of the search engine device. The control logic may also be configured to generate interrupts or asynchronous signals that notify an issuing command source of context completion.

13 Claims, 3 Drawing Sheets

CAM-BASED SEARCH ENGINES AND PACKET COPROCESSORS HAVING RESULTS STATUS SIGNALING FOR COMPLETED CONTEXTS

REFERENCE TO PRIORITY APPLICATION

This application claims priority to U.S. Provisional Application Ser. No. 60/516,178, filed Oct. 31, 2003, the disclosure of which is hereby incorporated herein by reference.

FIELD OF THE INVENTION

The present invention relates to integrated circuit devices and, more particularly, to CAM-based search engines and packet coprocessors and methods of operating same.

BACKGROUND OF THE INVENTION

Conventional network processor units (NPU) may be interfaced to integrated IP coprocessors (IIPC) in a manner that enables both SRAMs and IIPCs to be operated on the same memory mapped bus. As illustrated by FIG. 1, a conventional IIPC 30 may be coupled through a standard memory mapped interface to an NPU 10, which operates as a command source. The address bits ADDR[23:22] represent a two-bit select field that identifies one of four possible IIPCs on the SRAM bus for which a read operation is directed. The NPU 10 may include an SRAM controller that is based on FIFO communication. The SRAM controller includes internal bus control state machines 20 and pin control state machines 14. Data and address information is transferred between these state machines using push and pull data FIFOs 12a and 12d and read and write command FIFOs 12b and 12c that supply read and write addresses to the pin control state machines 14.

The IIPC 30 is illustrated as including a content addressable memory (CAM) core 36 and logic 38 that couples the CAM core 36 to the memory mapped interface. This memory mapped interface is illustrated as including read control logic 32 and write control logic 34. The write control logic 34 is configured to receive an address ADDR[21:0], a write enable signal WE_N[1:0], input data DATAIN[15:0] and input parameters PARIN[1:0]. The read control logic 32 is configured to receive the address ADDR[21:0] and a read enable signal RE_N[1:0] and generate output data DATAOUT[15:0] and output parameters PAROUT [1:0]. Like the SRAM controller within the NPU 10, this memory mapped interface is based on FIFO communication. The IIPC 30 performs operations using the input data DATAIN [15:0] and input parameters PARIN[1:0] and then passes back result values to the NPU 10. The timing between the receipt of the input parameters and the return of the corresponding result values is not fixed. Instead, it is determined by the amount of time the IIPC 30 requires to execute the specified instruction and depends on the number and type of other instructions currently pending within the IIPC 30.

These pending instructions are initially logged into respective instruction control registers 50 that support a plurality of separate contexts (shown as a maximum of 128). These instructions may be processed in a pipelined manner. The result values generated at the completion of each context are provided to respective result mailboxes 40. The validity of the result values within the mailboxes 40 is identified by the status of the done bit within each result mailbox 40. Accordingly, if a read operation is performed before the result values are ready, the NPU 10 will be able to check the validity of the done bit associated with each set of result values to determine whether the corresponding values of valid. However, because there can be multiple contexts in progress within the IIPC 30 at any given time and because the completion of the contexts does not necessarily occur in the same sequence as the requests were made, the NPU 10 may need to regularly poll the result mailboxes 40 at relatively high frequency to obtain new results as they become valid. Unfortunately, such regular polling can consume a substantial amount of the bandwidth of instructions that are issued to the IIPC 30 and lead to relatively high levels of operational inefficiency when the IIPC 30 is running a large number of contexts. Thus, notwithstanding the IIPC 30 of FIG. 1, which is capable of supporting a large number of contexts, there continues to be need for more efficient ways to communicate result status information from an IIPC to a command source, such as an NPU.

SUMMARY OF THE INVENTION

Integrated search engine devices according to embodiments of the present invention include control logic that supports direct reads of information that summarizes the done status of multiple contexts being handled by the search engine device. This done status information may be maintained in dedicated registers that are configured to support high bandwidth utilization from a data port of the search engine device. The control logic may also be configured to generate interrupts or asynchronous signals that notify an issuing command source of context completion.

In particular, search engine devices according to first embodiments of the present invention include a content addressable memory (CAM) core that is configured to support at least one database of searchable entries therein. A control circuit is also provided between an interface of the search engine device and the CAM core. This control circuit is configured to generate at least one signal at an output of the search engine device in response to detecting a done status of at least one of a plurality of result status signals. These result status signals indicate states of completion of a corresponding plurality of contexts being handled by the search engine device. In some of these embodiments, the at least one signal may provide notification (e.g., persistent notification) to the command source (e.g., network processor) and/or constitute an interrupt that prompts the command source to identify the cause of the interrupt (e.g., by issuing a read command to evaluate the states of the result status signals).

If the at least one signal is to provide asynchronous notification, then it may be generated as an aggregate result status (ARS) signal. This ARS signal, which may be generated by combinational logic, may be configured to have a leading edge that is synchronized with a transition of a result status signal, when the transition indicates completion of a first-to-finish one of the plurality of contexts being handled by the search engine device during overlapping time intervals. Following the leading edge, the aggregate result status signal may remain in an active state so long as a value of any one of the plurality of result status signals indicates a state of completion of a respective one of the plurality of contexts.

The control circuit may further include a plurality of context specific result mailboxes that are configured to store return values associated with corresponding ones of the plurality of contexts. A result status register is also provided. This result status register, which is configured to be readable by the command source, stores the done status values associated with the plurality of contexts in a manner that can be read efficiently by the command source. For example, if the search engine device is configured to support 128 contexts, then the entire contents of the result status register may be provided to the command source as four 32-bit words that pass across a 32-bit data bus or eight 16-bit words that pass across a 16-bit data bus.

The control circuit may also be configured to include interrupt and non-interrupt indication circuits. These circuits are configured to receive the plurality of result status signals and generate either an asynchronous aggregate result status signal (ARS) or an interrupt that prompts the command source to evaluate the basis for the interrupt. These circuits are also configured to receive result status routing information from a result status select register. This result status select register may also be a 128-bit register that stores one bit of routing information for each context.

Search engine devices according to additional embodiment of the present invention may include a memory mapped interface, such as a quad data rate interface, and a content addressable memory (CAM) core that is configured to support at least one database of searchable entries therein. A control circuit is also provided. The control circuit is electrically coupled to the memory mapped interface and the CAM core. The control circuit is configured to generate an aggregate result status signal at an output of the memory mapped interface. This aggregate result status signal reflects a done or undone status of at least one of a plurality of contexts being handled by the search engine device. The control circuit of these embodiments may also include a round robin scheduler and finite state machine that control access to the CAM core.

DETAILED DESCRIPTION OF PREFERRED EMBODIMENTS

Figure 1:
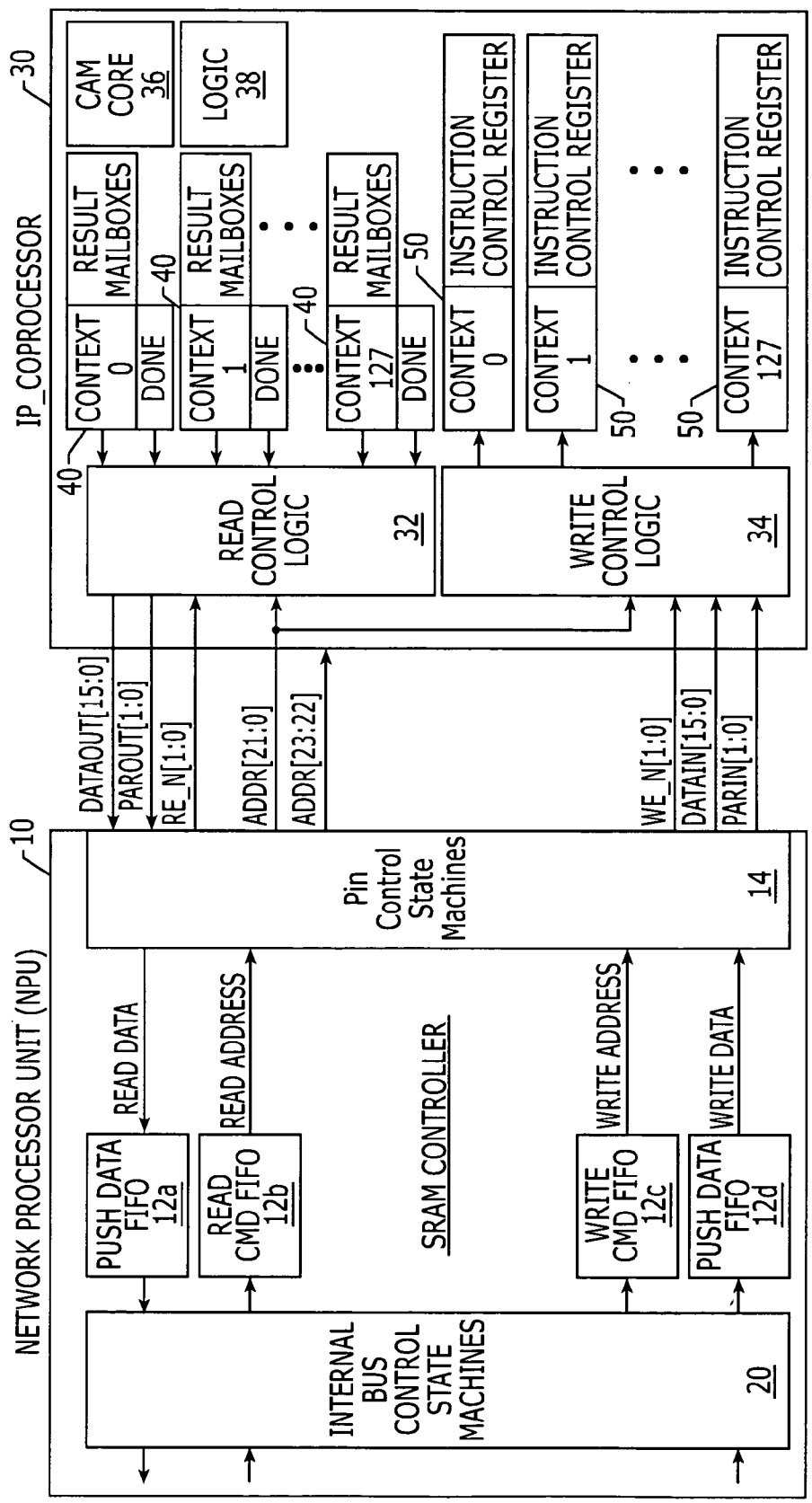
FIG. 1 is a block diagram of a network processor unit having an SRAM controller therein that is coupled to a conventional integrated IP-coprocessor (IIPC).

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. Moreover, when a device or element is stated as being responsive to a signal(s), it may be directly responsive to the signal(s) or indirectly responsive to the signal(s) (e.g., responsive to another signal(s) that is derived from the signal(s)).

Figure 2:
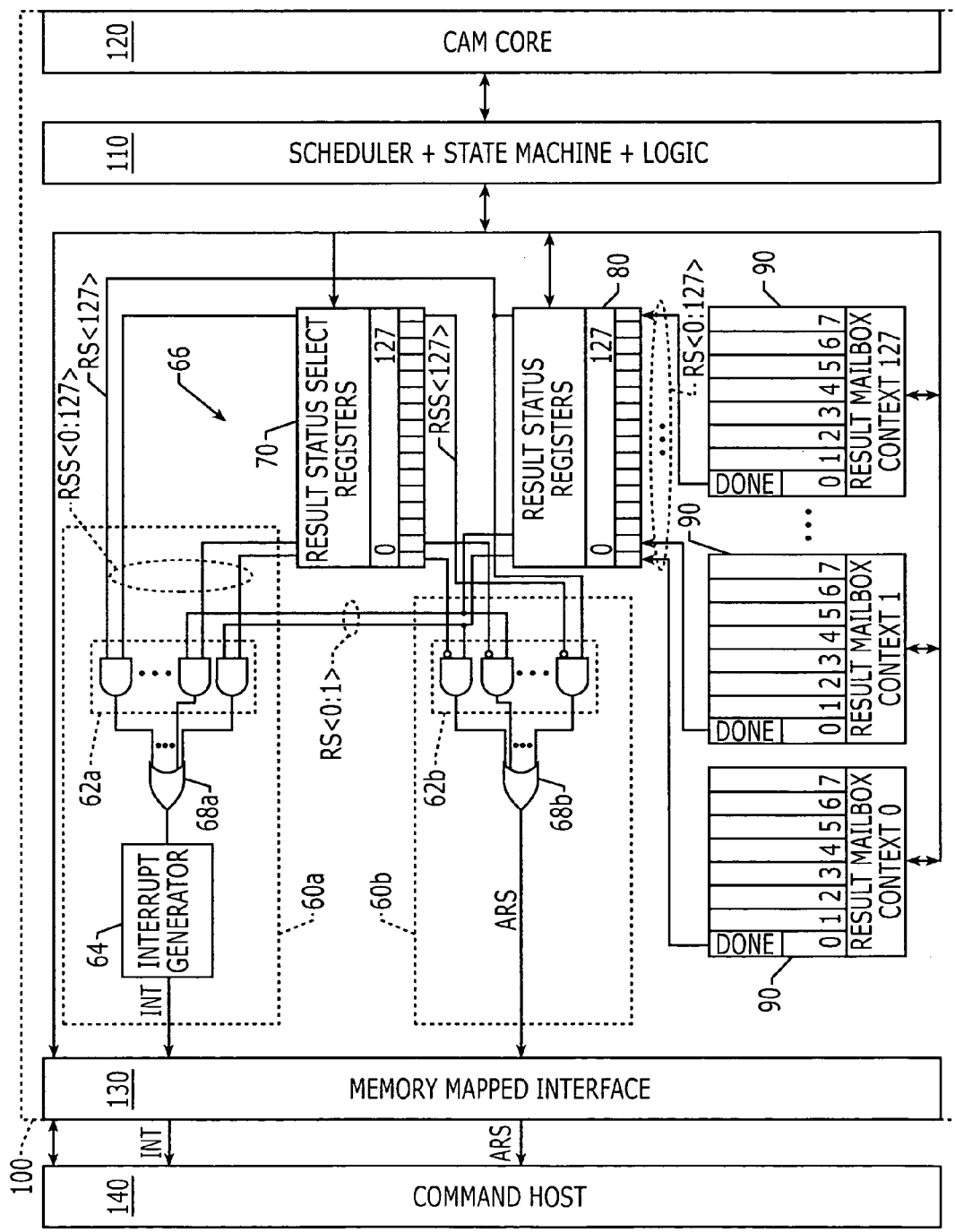
FIG. 2 is an electrical schematic that illustrates an integrated search engine device having result status signaling, according to an embodiment of the present invention.

Referring now to FIG. 2, an integrated IP coprocessor (IIPC) 100 that is configured to operate as an integrated search engine device according to embodiments of the present invention will be described. This IIPC 100 includes a CAM core 120 having at least one database of searchable entries therein. In typical embodiments, the CAM core 120 may have as many as sixteen independently searchable databases. Programmable power management circuitry (not shown) may also be integrated with the CAM core 120 so that only a selected database(s) consumes power during a search operation. CAM cores having a fewer or larger number of databases are also possible.

The CAM core 120 is electrically coupled to a control circuit. The control circuit is illustrated as including a scheduler, a finite state machine and logic 110 that can support multiple overlapping contexts. The control circuit is further illustrated as including: a plurality of result mailboxes 90, a result status register(s) 80, a result status select register 70, an interrupt indication circuit 60a and a non-interrupt indication circuit 60b. The result status register 80, result status select register, interrupt indication circuit 60a and non-interrupt indication circuit 60b collectively define a result status notification circuit.

The result mailboxes are illustrated as having a capacity to support result values from as many as 128 contexts. These mailboxes 90 also retain information that identifies whether the result values are valid or not. Result values are valid when the respective context is complete and the result values generated by the completed context have been loaded into a respective mailbox 90. When this occurs, the done status bit (DONE) associated with a respective mailbox 90 is set and remains set until such time as the respective mailbox 90 is read, at which point it is reset.

The result status register(s) 80 is configured to retain a copy of the done status bits for the result mailboxes 90. In the illustrated embodiment, the result status register 80 is illustrated as a 128-bit register. This register may be partitioned at 32-bit segments (i.e., four registers), which support efficient reading of the contents of the result status register 80 across a 32-bit wide bus at a single data rate (SDR) or a 16-bit wide bus at a dual data rate (DDR). The result status register 80 receives and generates a 128-bit result status signal RS<0:127>, which indicates the states of completion of a corresponding plurality of contexts being handled by the search engine device. For example, if the result status signal RS<0:127> is set to the value of <0101000 . . . 000110>, then contexts 1, 3, 125 and 126 are done and the result values for those contexts are valid and the remaining contexts are not done.

The result status select register(s) 70 is a 128-bit programmable register that generates a result status select signal RSS<0:127>. This signal operates to select one of two indication circuits for receipt of active bits within the result status signal RS<0:127>. These indication circuits are illustrated as an interrupt indication circuit 60a and a non-interrupt indication circuit 60b. The interrupt indication circuit 60a includes an interrupt generator 64 that generates an interrupt INT to the command host 140 via the memory mapped interface 130. The interrupt generator 64 may also generate interrupts in response to other activity within the control circuit, according to a predefined protocol. In contrast, the non-interrupt indication circuit 60b generates an asynchronous aggregate result status signal (ARS) to the command host 140 via the memory mapped interface 130. This ARS signal is configured to have a leading edge that occurs when a first one of a selected plurality of contexts is completed and an active level that is held so long as at least one of the selected plurality of contexts remains completed (i.e., done status bit remains set). The command host 140 may include circuitry that regularly polls the ARS signal line to determine its status.

The interrupt indication circuit 60a has a first bank 62a of AND gates that output to an OR gate 68a. The non-interrupt indication circuit 60b has a second bank 62b of AND gates that output to an OR gate 68b. When one or more bits of the result status select signal RSS<0:127> are set high to logic 1 levels, then the corresponding result status signals RS<0:127> are passed to the inputs of the OR gate 68a. If any of these result status signals are switched to active logic 1 values, then the output of the OR gate 68a will switch and cause the interrupt generator 64 to produce an interrupt INT at the memory mapped interface 130. But, when one or more bits of the result status select signal RSS<0:127> are set low to logic 0 levels, then the corresponding result status signals RS<0:127> are passed to the input of the OR gate 68b. Accordingly, if the result status select signal RSS<0:127> is set so that RSS<0:127>=<00000 . . . 0000>, then the aggregate result status signal at the output of the OR gate 68b will be switched high (or held high) whenever any of the result status bits RS<0:127> is set high to indicate the completed state of a respective context. Alternatively, if the result status select signal RSS<0:127> is set so that RSS<0:127>=<11111 . . . 1111>, then the signal at the output of the OR gate 68a will be switched high (or held high) whenever any of the result status bits RS<0:127> is set high to indicate the completed state of a respective context. In this manner, the result status select register 70 provides programmable control over how the result status signals are to be reported to the command host 140.

In alternative embodiments, the second bank 62b of AND gates may be split into four groups of AND gates that receive the following result status signals RS<0:31>, RS<32:63>, RS<64:95> and RS<96:127>. Four OR gates may be used in place of the single OR gate 68b and each of these four OR gates may be coupled to respective groups of AND gates. Thus, four ARS signals may be generated by the non-interrupt indication circuit 60b. Circuitry (not shown) may be provided to serialize the four ARS signals onto a single ARS signal line that is electrically coupled to the command host. The command host may then evaluate the state of the single ARS signal line to determine which group or groups of 32-bits within the result status register 80 indicate the presence of a completed context. In this manner, it may not be necessary for the command host to read the entire contents of the result status register 80 in order to identify which result mailboxes 90 to read.

Based on the above-described configuration of the control circuit, the completion of any context within the IIPC 100 will result in the transfer of result values from the scheduler, state machine and logic 110 to a corresponding result mailbox 90. Assuming this context represents a first-to-finish operation (e.g., lookup within the CAM core), then the setting of the respective done bit within the result mailbox 90 will result in the latching of this done information by the result status register(s) 80. If this done information relates to context 0, then the result status signal RS<0:127> will equal <10000 . . . 000>. If the result status select register is set so that the result status select signal RSS<0:127> equals <0XXXXXX . . . X>, where X represents a "don't care" for purposes of this example, then the aggregate result status signal ARS will be set to an active high level and passed from the memory mapped interface 130 to the command host 140. Alternatively, if the result status select register is set so that the result status select signal RSS<0:127> equals <1XXXXXX . . . X>, then the output of the OR gate 68a within the interrupt indication circuit 60a will switch high. This active high signal at an input of the interrupt generator 64 will result in the generation of an interrupt that passes to the memory mapped interface 130 and the command host 140.

In response to the generation of an interrupt INT or an active high aggregate result status signal ARS, the command host 140 may issue an operation to read the result status register 80. This operation includes generating an address ADDR[23:0] to the memory mapped interface 130. The fields of this address are illustrated by TABLE 1. The two most significant bits of the address operate to select the particular IIPC 100 for which the read operation is destined. The seven address bits ADDR<21:15> identify a particular context within a range of 128 possible contexts. The eleven address bits ADDR<4:14> are not used. The address bit ADDR<3> represents a result status identifier (RES_STATUS). If this bit is set to a first logic value (e.g., 0), then an entry within the result mailbox 90 associated with the designated context is to be read back to the command host 140. On the other hand, if the result status identifier is set to a second logic value (e.g., 1), then a designated portion of the result status register 80, which identifies the value of 32 result status signals, is to be read back to the command host. The final 3-bit portion of the address, shown as ADDR<2:0>, identifies an entry value. As illustrated by TABLE 2, this entry value identifies one of eight entries to be read from the designated result mailbox 90 when the result status identifier RES_STATUS is set to a logic 0 value. Alternatively, the entry value identifies one of four portions of the result status register 80 to read from when the result status identifier is set to a logic 1 value. In this manner, four consecutive read operations may be performed to enable the command host to read the entire contents of the result status register 80 and thereby readily identify which ones of the 128 result mailboxes 90 contain valid result values.

TABLE 1

| 23 22 21 20 | 19 18 17 16 15 14 13 12 11 | 10 9 8 7 6 5 4 | 3 | 2 1 0 |
|---|---|---|---|---|
| SELECT | CONTEXT | NOT USED | RES STATUS | ENTRY VALUE |

TABLE 2

| RES_ STATUS | ENTRY VALUE | ACTION |
|---|---|---|
| 0 | 000 | READ ENTRY 0 IN CONTEXT SPECIFIC MAILBOX |
| 0 | 001 | READ ENTRY 1 IN CONTEXT SPECIFIC MAILBOX |

TABLE 2-continued

| RES_STATUS | ENTRY VALUE | ACTION |
|---|---|---|
| 0 | 010 | READ ENTRY 2 IN CONTEXT SPECIFIC MAILBOX |
| 0 | 011 | READ ENTRY 3 IN CONTEXT SPECIFIC MAILBOX |
| 0 | 100 | READ ENTRY 4 IN CONTEXT SPECIFIC MAILBOX |
| 0 | 101 | READ ENTRY 5 IN CONTEXT SPECIFIC MAILBOX |
| 0 | 110 | READ ENTRY 6 IN CONTEXT SPECIFIC MAILBOX |
| 0 | 111 | READ ENTRY 7 IN CONTEXT SPECIFIC MAILBOX |
| 1 | 000 | READ RESULT STATUS BITS [31:0] |
| 1 | 001 | READ RESULT STATUS BITS [63:32] |
| 1 | 010 | READ RESULT STATUS BITS [95:64] |
| 1 | 011 | READ RESULT STATUS BITS [127:96] |
| 1 | 100 | RESERVED |
| 1 | 101 | RESERVED |
| 1 | 110 | RESERVED |
| 1 | 111 | RESERVED |

Figure 3:
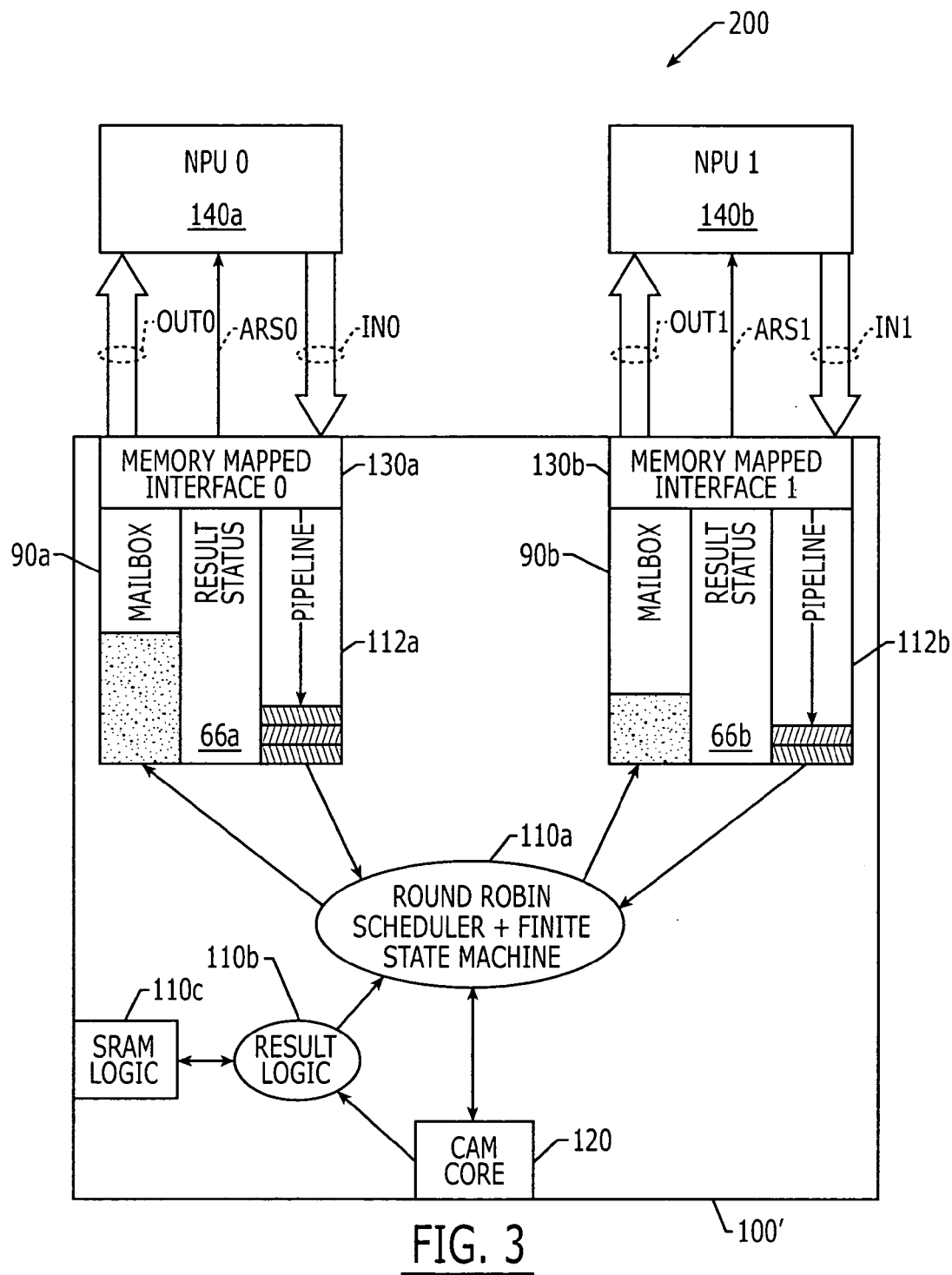
FIG. 3 is a block diagram of an integrated circuit system that includes a pair of network processor units (NPUs) and an integrated search engine device having two quad data rate interfaces, according to additional embodiments of the present invention.

Referring now to FIG. 3, an integrated circuit system 200 according to another embodiment of the present invention will be described. This system 200 is illustrated as including an IIPC 100' that is configured in accordance with the IIPC 100 of FIG. 2. In addition, the IIPC 100' includes a pair of memory mapped interfaces 130a and 130b that communicate with a pair of network processor units (NPUs) 140a and 140b. Each memory mapped interface 130a and 130b is associated with respective mailboxes (90a and 90b), result status notification circuits (66a and 66b) and pipelined instruction circuits 112a and 112b. These pipelined instruction circuits 112a and 112b share access to a round robin scheduler and finite state machine 110a. Logic circuits, in the form of SRAM logic 10c and result logic 110b, communicate with the CAM core 120 and the state machine 110a.

These illustrated embodiments may be applied in an appropriate case to other packet coprocessors, including those that are not necessarily CAM-based. Such packet coprocessors may include decryption chips and content inspection chips that support multiple contexts, for example.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated search engine device, comprising:
   a content addressable memory (CAM) core that is configured to support at least one database of searchable entries therein; and
   a control circuit that is configured to generate at least one signal at an output of the search engine device in response to detecting a done status of at least one of a plurality of result status signals that indicate states of completion of a corresponding plurality of contexts being handled by the search engine device;
   wherein the at least one signal comprises an aggregate result status signal having a leading edge that is synchronized with a transition of a result status signal when the transition indicates completion of a first-to-finish one of the plurality of contexts being handled by the search engine device during overlapping time intervals.

2. The device of claim 1, wherein said control circuit comprises combinational logic that is configured to maintain the aggregate result status signal in an active state so long as a value of any one of the plurality of result status signals indicates a state of completion of a respective one of the plurality of contexts.

3. The device of claim 1, wherein said control circuit further comprises:
   a plurality of context specific result mailboxes that are configured to store return values associated with corresponding ones of the plurality of contexts; and
   a result status register that is configured to store done status values associated with the plurality of contexts.

4. The device of claim 3, wherein the search engine device is configured to support a maximum number N of contexts; and wherein said result status register comprises N single-bit storage devices.

5. The device of claim 4, wherein the search engine device further comprises a memory mapped interface that is coupled to an M-bit wide data bus; and wherein a value of N/M equals a positive integer greater than one.

6. An integrated search engine device, comprising:
   a memory mapped interface; and
   a control circuit electrically coupled to said memory mapped interface, said control circuit configured to generate an aggregate result status signal at an output of said memory mapped interface in response to detecting a done status of at least one of a plurality of result status signals, which indicate states of completion of a corresponding plurality of contexts being handled by the search engine device;
   wherein the control circuit is configured so that the aggregate result status signal has a leading edge that is synchronized with a transition of a result status signal when the transition indicates completion of a first-to-finish one of the plurality of contexts being handled by the search engine device during overlapping time intervals.

7. The device of claim 6, wherein said control circuit comprises combinational logic that is configured to maintain the aggregate result status signal in an active state so long as a value of any one of the plurality of result status signals indicates a state of completion of a respective one of the plurality of contexts.

8. The device of claim 6, wherein said control circuit further comprises:
   a plurality of context specific result mailboxes that are configured to store return values associated with corresponding ones of the plurality of contexts; and
   a result status register that is configured to store done status values associated with the plurality of contexts.

9. The device of claim 8, wherein the search engine device is configured to support a maximum number N of contexts; and wherein said result status register comprises N single-bit storage devices.

10. The device of claim 9, wherein the search engine device further comprises a quad data rate interface that is coupled to an M-bit wide data bus; and wherein a value of N/M equals a positive integer greater than one.

11. A packet coprocessor chip, comprising:
   a control circuit that is configured to generate at least one signal at an interface of the coprocessor chip in response to detecting a done status of at least one of a plurality of result status signals that indicate states of completion of a corresponding plurality of contexts being handled by the coprocessor chip; and wherein the at least one signal comprises an aggregate result status signal having a leading edge that is synchronized with a transition of a result status signal when the transition indicates completion of a first-to-finish one of the plurality of contexts being handled by the coprocessor chip during overlapping time intervals.

12. The chip of claim 11, wherein said control circuit comprises combinational logic that is configured to maintain the aggregate result status signal in an active state so long as a value of any one of the plurality of result status signals indicates a state of completion of a respective one of the plurality of contexts.

13. The chip of claim 11, wherein said control circuit further comprises:
a plurality of context specific result mailboxes that are configured to store return values associated with corresponding ones of the plurality of contexts; and
a result status register that is configured to store done status values associated with the plurality of contexts.

* * * * *